Figures 1, 1A:
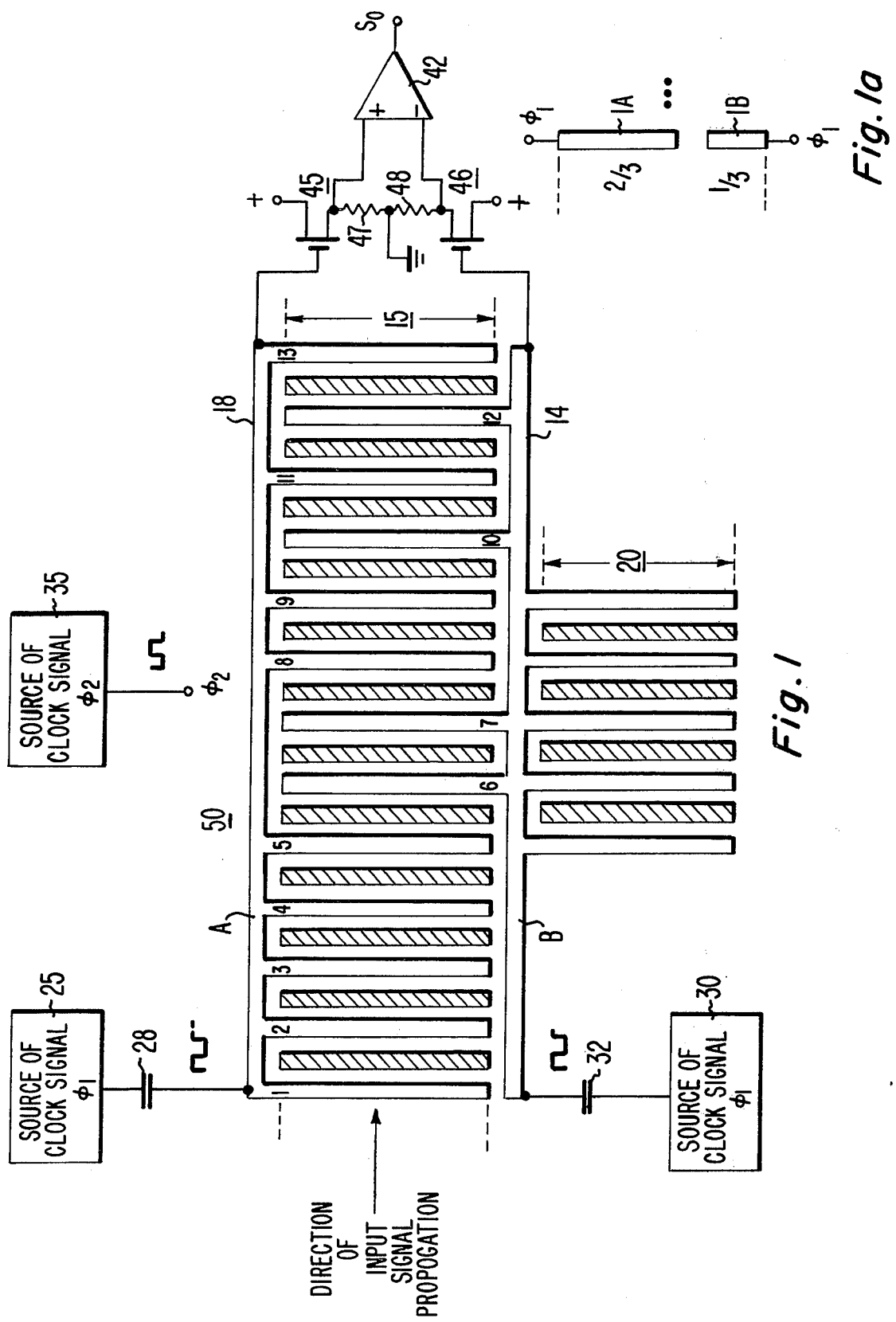

United States Patent [19]

Carnes et al.

[11] 4,126,836
[45] Nov. 21, 1978

[54] BALANCED CAPACITANCE CHARGE TRANSFER DEVICE

[75] Inventors: James E. Carnes, North Brunswick; Robert H. Dawson, Griggstown, both of N.J.

[73] Assignee: RCA Corporation, New York, N.Y.

[21] Appl. No.: 782,753

[22] Filed: Mar. 30, 1977

[51] Int. Cl.² ............... H03H 7/28; G11C 19/28; H01L 27/10; H03K 17/60
[52] U.S. Cl. .................. 333/70 T; 307/221 D; 357/24
[58] Field of Search ........... 333/70 T, 70 R; 357/24; 307/221 R, 221 C, 221 D, 293, 294, 295, 304; 364/862

[56] References Cited
U.S. PATENT DOCUMENTS
4,032,867 6/1977 Engeler et al. .................. 357/24 X Primary Examiner—Alfred E. Smith
Assistant Examiner—Marvin Nussbaum
Attorney, Agent, or Firm—Eugene M. Whitacre; William H. Meagher; Ronald H. Kurdyla

[57] ABSTRACT

An arrangement of charge transfer devices comprising a main signal transfer path defined by first and second sets of charge transfer electrodes, and an auxiliary path independent of the main path including a predetermined number of electrodes. Capacitances are respectively associated with the electrodes forming the first and second sets of electrodes of the main path, and with the electrodes of the auxiliary path. The electrodes of the auxiliary path are connected to the one of the sets of electrodes of the main channel to establish a desired relationship (e.g., balance) between the capacitances of the first and second sets of electrodes.

12 Claims, 2 Drawing Figures

BALANCED CAPACITANCE CHARGE TRANSFER DEVICE

The United States Government has rights to this invention pursuant to Contract No. DAAB07-75-C-1323 awarded by the Department of the Army.

This invention relates to charge transfer devices and, more particularly, to a charge transfer device arrangement compensated for capacitance imbalance.

Semiconductor charge transfer devices (CTDs) include charge coupled devices (CCDs) and bucket brigade devices (BBDs), and operate by transferring a signal charge from one storage capacitance to the next at a rate determined by a clock (switching) signal, as is known. Charge transfer devices offer numerous advantages in signal processing applications, particularly in the design of signal delay lines and filters.

Charge transfer devices used for signal filtering purposes are well known. For example, a known method of constructing a fixed weight CCD transversal filter utilizes a "split gate" technique. An example of such a filter is described in U.S. Pat. No. 3,819,958. The split gate technique typically involves a series arrangement of spaced gate electrodes, each comprising a nominally "positive" electrode portion and a nominally "negative" electrode portion separated by a "split" or gap. The position of the split for each gate electrode defines the relative area of the positive and negative electrode portions, and accordingly determines a signal weighting factor at a given split gate electrode location. Since the capacitance of each split gate electrode is responsive to the amount of charge underlying each gate electrode, a signal weight at a given gate electrode location is proportional to the capacitance at that location, and is represented by the difference in capacitance between the positive and negative gate electrode portions at that location. A filtered output signal typically is provided by developing a signal representative of the difference between the total capacitance of the positive and negative split gate electrodes. A differential amplifier with inputs respectively coupled to the positive and negative split gate electrodes is often employed for this purpose.

It is important that the capacitances respectively associated with the positive and negative gate electrodes are substantially equal, since a voltage imbalance due to capacitance imbalance can distort the detected information at the output of the differential amplifier, and can cause saturation of the differential amplifier. A need to provide balanced capacitance is particularly evident, for example, when the CTD split gate arrangement is required to exhibit some signal response at D.C. (i.e., zero Hertz), or when the number of weighted positive gate electrodes differs from the number of weighted negative gate electrodes (e.g., in a binary weighted transversal filter such as a 13-bit Barker coded filter).

In some cases, the capacitance imbalance can be compensated by tailoring the values of associated load resistors or capacitors through which the clock signals can be coupled to the positive and negative gate electrodes. But such compensation can be inconvenient or impractical, especially if the capacitance imbalance is caused by variations of fabrication process parameters when the CTD arrangement is integrated. Also, such compensation can be achieved for only one particular process variation when the clock signal coupling capacitors are fabricated in the same integrated circuit as the CTD structure.

Capacitance balance also can be provided by means of a discrete variable capacitor coupled to an input of the differential amplifier, as described in aforementioned U.S. Pat. No. 3,819,958. In accordance with this approach, the capacitor is adjusted to "null out" the capacitance imbalance so that the output of the differential amplifier is representative substantially only of signal information. However, this approach can be uneconomical when such a capacitor is unduly large and costly, and inconvenient because time consuming adjustments must be made on a unit-to-unit basis. Also, this approach does not achieve a reproducible CTD arrangement with balanced capacitance.

It is therefore desirable to provide a reproducible CTD arrangement which exhibits balanced capacitance substantially independent of process variations. It is also desirable to provide such an arrangement which permits dynamic adjustment of any minor capacitance imbalance which may occur due to process variations. It is furthermore desirable to provide a balanced capacitance CTD signal processing arrangement wherein output signal information is not distorted due to capacitance imbalance.

A semiconductor electrical charge transfer device in accordance with the present invention comprises first and second pluralities of spaced conductive electrodes. The first plurality comprises conductive charge transfer electrodes defining charge storage locations along a signal transfer path. The first plurality is formed by a first set of conductive areas coupled to a first conductor and having an associated first capacitance responsive to charge underlying the first set of conductive areas, and a second set of conductive areas coupled to a second conductor and having an associated second capacitance responsive to charge underlying the second set of conductive areas. The second plurality comprises a predetermined number of electrodes defining charge storage locations of an auxiliary path independent of the signal transfer path. Each electrode of the second plurality has an associated capacitance responsive to charge underlying each of the electrodes. The second plurality of electrodes is conductively coupled to one of the first and second conductors, so that capacitances respectively associated with the first and second conductors exhibit a predetermined ratio different from the ratio of said first capacitance to said second capacitance.

FIG. 1 of the drawing illustrates, partially in schematic circuit diagram form and partially in block diagram form, a CCD arrangement in accordance with the present invention; and FIG. 1a illustrates an alternate form of a portion of the CCD arrangement shown in FIG. 1.

In FIG. 1, a transversal filter comprises a CCD device 50 including a signal delay line represented by a main signal transfer channel or path 15, and an auxiliary or "dummy" channel or path 20. Device 50 comprises a nominally "positive" electrode bank 18 including a first conductive common clock line A and a plurality of "positive" weighted electrodes 1–5, 8, 9, 11 and 13 coupled to clock line A, and a nominally "negative" electrode bank 14 including a second conductive common clock line B and a plurality of "negative" weighted electrodes 6, 7, 10 and 12 coupled to clock line B. Auxiliary channel 20 comprises five auxiliary gate electrodes connected in common to the second clock line. A number of intermediate electrodes (shown by vertical shading) are individually disposed between each of the weighted electrodes of the main and auxiliary CCD channels. Each of the weighted and intermediate electrodes which form main channel 15 and the electrodes forming auxiliary channel 20 are of similar configuration and surface area in this example.

Periodic clock signals $\phi_1$ for the positive weighted electrodes are supplied via a coupling capacitor 28 from a source of clock signals 25, and clock signals $\phi_1$ for the negative weighted electrodes are supplied via a coupling capacitor 32 from a source of clock signals 30. Clock signals from sources 25 and 30 are of similar amplitude and phase and can be supplied from a common source. Clock signals $\phi_2$ for the intermediate electrodes are supplied from a source of clock signals 35, although connections from each of the intermediate electrodes to source 35 are not shown in the interest of clarity.

Techniques for fabricating CTD devices are known. Briefly, for a CCD arrangement, the weighted and intermediate electrodes are arranged in a spatially periodic metallization pattern on a major surface of a semiconductor (e.g., silicon) substrate. The semiconductor is coated with an oxide insulator (e.g., silicon dioxide) to define a sequence of integrated metal-oxide-semiconductor (MOS) type capacitors, so that localized electrical charge accumulation in the semiconductor can be propagated or shifted through the semiconductor (i.e., left to right in main CCD channel 15) sequentially between adjacent MOS capacitors in response to periodic clock signal pulses $\phi_1$ and $\phi_2$ applied to the weighted and intermediate electrodes. Auxiliary channel 20 is independent of main signal transfer channel 15, and no signal charge is conveyed by auxiliary channel 20 in this example. In this example, clock signals $\phi_1$ and $\phi_2$ are of the same frequency (e.g., 16 KHz) but oppositely phased in order to effect the sequential shifting of the charge accumulations, and represent a two-phase clock system. Other multi-phase clock systems are possible. The electrical charges are initially injected at the input (left) end of main CCD channel 15 in the form of analog or digital information in accordance with known input coupling techniques.

In a CCD version of a CTD, the signal charges injected into the semiconductor, when not being propagated, are localized as isolated inversion layers at the oxide-semiconductor interface. The charges are shifted through the semiconductor under the influence of the clock pulses. For a better understanding of the structure, operation and methods of fabricating charge transfer devices, see the text, "Charge Transfer Devices" by Sequin and Tompsett, published by Academic Press, Inc. (1975) and the references cited therein.

Positive weighted electrode bank 18 is coupled to one input of a differential amplifier 42 via an MOS buffer device 45 and a resistor 47, and negative weighted electrode bank 14 is coupled to another input of amplifier 42 via an MOS buffer device 46 and a resistor 48. Differential amplifier 42 provides an output signal $S_0$ representative of the differences between the values of charge-responsive capacitances respectively associated with positive and negative banks 18 and 14.

Neglecting auxiliary channel 20 for the moment, the illustrated arrangement of positive bank 18 and negative bank 14, defining main signal transfer channel 15, forms a known 13-bit Barker coded transversal filter. In this arrangement, each of gates 1-5, 8, 9, 11 and 13 is assigned a nominal weight of "one" (unity), and each of gates 6, 7, 10 and 12 is assigned a nominal weight of "zero".

Each of electrodes 1-13 and the intermediate electrodes defines a signal delay location. The weighting of each of electrodes 1-13 is accomplished by "splitting" each of the nominally positive and negative weighted electrodes into two spaced portions. The amount of weighting present at a given delay location is determined by the relative areas of the two electrode portions at that location. Thus electrode 1 at a first delay location receives a relative weight of "one" in this example, since the electrode at this location is "split" such that there is no electrode portion associated with negative bank 14 at this weighting location. Thus electrode 1 defines the entire electrode surface area at the first location beneath which a capacitance is developed in response to signal or quiescent charge underlying electrode 1. Similarly, electrode 6 receives a relative weight of "zero", since the electrode at this location is "split" such that there is no electrode portion associated with positive bank 18 at this location.

Thus, weighted electrode 1 can be considered as having a first portion of a given surface area coupled to clock line A, and a second portion of zero surface area associated with clock line B. Similarly, electrode 6 can be considered as having first and second portions of a zero surface area and a given surface area respectively associated with clock lines A and B. However, each of the weighted electrodes can be arranged (i.e., split) to define other preselected signal weighting factors in accordance with the requirements of a particular signal processing system. An example of such alternative weighting is shown in FIG. 1a for electrode 1. In FIG. 1a, electrode 1 is split into first and second electrode portions 1A and 1B having relative surface areas and hence weighting factors of two-thirds and one-third, respectively. The intermediate electrodes are not assigned weights since these electrodes are not involved in the signal filtering function other than to provide a means of transferring signal charge along main CCD channel 15, in this example.

A transversal filter of the Barker coded type serves to convolve an incoming signal with the coded impulse response of the filter. The convolution can be performed by differentially combining weighted signal responsive voltage from the positive and negative weighted delay locations. In practice, weighted signal responsive voltage from each delay location of the main channel is combined to produce an impulse response which is the Fourier Transform of a desired frequency response characteristic of the filter.

In particular, a Barker coded transversal filter relies on a fixed binary pattern to provide signal correlation in the case of a signal representing a data "one", or to provide anticorrelation in the case of a signal representing a data "zero". Signal data in the form of a "one" or "zero" (or an analog signal with any level between a "one" and "zero") could be confused with or replaced by random noise or spurious signals. The process of signal correlation allows signals to be processed to be recognized in a noisy environment. With a fixed signal pattern in accordance with a thirteen-bit Barker code, each data "one" and "zero" is replaced by respective patterns of "ones" and "zeros", totalling thirteen. When this pattern is received and correlated by an appropriate signal translator in the frequency domain, data with a fixed, repetitive pattern in accordance with the Barker code is reinforced by the number of correlation bits (i.e., 13 for a 13-bit Barker coded system). The correlation process in such a system produces a thirteen-to-one improvement in signal-to-noise ratio, thereby facilitating signal detection.

The operation of weighted CTD transversal filters are well known and need not be explained further here. Additional information concerning such filters is contained in U.S. Pat. No. 3,819,958 and in the text of Sequin and Tompsett noted previously.

Differential amplifier 42 detects a voltage difference between electrode banks 18 and 14. A differential voltage appearing across resistors 47 and 48 is proportional to a differential voltage developed between positive and negative banks 18 and 14 in response to the capacitances associated with the electrodes of banks 18 and 14. The differential voltage is detected by amplifier 42, and the output $S_0$ of amplifier 42 represents the signal information corresponding to the differential voltage.

In this connection it is noted that a voltage divider is formed by coupling capacitor 28 and the capacitance associated with bank 18, and by coupling capacitor 32 and the capacitance associated with bank 14. In a typical case, the value of each coupling capacitor is chosen to be about twice the value of the expected capacitance of the associated split gate bank under quiescent signal conditions. The amplitude of the clock signals $\phi_1$ is substantially constant (e.g., 15 volts), and the value of the respective capacitances of each weighted electrode bank is proportional to the magnitude of the signal and quiescent charge underlying the weighted electrodes and varies with variations in signal charge magnitude. Thus a voltage appearing at each of banks 18 and 14 by virtue of capacitive voltage divider action is representative of the magnitude of signal and quiescent charge at a given point in time. A correlated output signal ($S_0$) is generated by differential amplifier 42 whenever the signal charge stored in the individual delay locations "match" the filter impulse response as defined by the weighted electrodes of banks 18 and 14.

It is noted that the illustrated CCD structure defining main channel 15 exhibits an unequal weighting pattern, since there are nine gates (i.e., 1–5, 8, 9, 11 and 13) with a "one" weight and four gates (i.e., gates 6, 7, 10 and 12) with a "zero" weight. This produces a capacitance imbalance which can be undesirable for the reasons mentioned earlier.

The capacitance imbalance can be compensated, for example, by adjusting the amplitudes of the clock signals $\phi_1$, or by adjusting the values of the coupling capacitors 28 and 32. But this can be inconvenient and, in the case of an integrated CCD structure, it would defeat the purpose of integration to require such adjustments.

Also, when integrated coupling capacitors 28 and 32 are desired to exhibit a value in predetermined relation (e.g., twice) with respect to the value of the quiescent capacitance of associated integrated electrode banks 18 and 14, an accurate prior determination of the capacitance of banks 18 and 14 under quiescent conditions is required so that the values of the coupling capacitances can be determined. However, the values of capacitance of the split gate banks 18 and 14 are likely to change between fabrication process runs. Such changes are likely to occur since implant conditions for buried-channel CCD structures can deviate from a design value and because the electrode overlaps can change if photoresist and etching procedures employed for establishing the gate electrode patterns deviate from design procedures. These factors among others can cause a lack of reproducibility of the ratio of coupling capacitance to the quiescent capacitance of the associated weighted electrode bank.

Auxiliary channel 20 provides the means by which balanced capacitance is achieved. The number of auxiliary electrodes of auxiliary channel 20 is chosen so that the number of these electrodes (i.e., five) plus the number of "zero" weighted electrodes (i.e., four) equals the number of "one" weighted electrodes (i.e., nine). The number of auxiliary electrodes is chosen so that the capacitance of electrode bank 14 is substantially equal to the capacitance of bank 18 under quiescent conditions. A typical quiescent condition is represented by a charge level in charge storage "wells" beneath the electrodes of about one-half full in both the main and auxiliary channels.

In essence, auxiliary channel 20 can comprise any number of auxiliary electrodes coupled to one of the weighted electrode banks to provide a predetermined amount of capacitance to develop a desired ratio between the capacitances of the weighted electrode banks.

When auxiliary channel 20 and main channel 15 are fabricated in integrated form in accordance with the same design criteria (e.g., structure, electrode spacing, oxide layer thickness, implant level) and have an appropriate number of electrodes as discussed, a reproducible CCD structure having balanced capacitance results. Weighted electrode banks 18 and 14 will exhibit substantially equal values of capacitance under quiescent signal conditions substantially independent of process variations.

Minor differences in the values of capacitance can occur, of course, but these differences can be compensated or nulled by adjusting the quiescent charge level of auxiliary channel 20, since the level of chage affects the capacitance contributed by auxiliary channel 20. For example, balanced capacitance of CCD structure 50 can be provided on a dynamic basis by an automatic feedback nulling technique. Such a technique can employ the output of differential amplifier 42, when main channel 15 is devoid of signal, to vary the (input) quiescent charge level of auxiliary channel 20 until the output of amplifier 42 is zero (i.e., capacitance balance exists).

It is also noted that other methods are known for sensing the signal responsive capacitances of the positive and negative weighted electrode banks. One such method discussed in U.S. Pat. No. 3,819,958 involves sensing a charging current which flows from a source of clock signals associated with the banks, through impedances (e.g., resistors) respectively coupled between the clock source and each of the positive and negative banks. The principles of the present invention apply in this case as well.

An arrangement in accordance with the present invention can comprise CCD or BBD charge transfer devices, and can be employed in a variety of signal processing applications such as active delay lines and comb filters in television signal processing systems.

What is claimed is:

1. A semiconductor electrical charge transfer device comprising:
a first plurality of spaced conductive charge transfer electrodes insulatingly disposed on a major surface of a semiconductor substrate and defining quiescent and signal charge storage locations along a signal transfer path, said first plurality comprising a first set of conductive areas coupled to a first conductor and having an associated first capacitance developed in response to charge underlying said first set of conductive areas, and a second set of conductive areas coupled to a second conductor and having an associated second capacitance developed in response to charge underlying said second set of conductive areas;

a second plurality of a predetermined number of spaced conductive electrodes insulatingly disposed on said major surface of said semiconductor substrate and defining quiescent charge storage locations of an auxiliary path adjacent to said signal transfer path, each electrode of said second plurality having an associated capacitance developed in response to charge underlying each of said electrodes;

means for conductively coupling said second plurality of electrodes to one of said first and second conductors; and wherein said number of electrodes of said auxiliary path is chosen so that quiescent capacitances respectively associated with said first and second conductors exhibit a predetermined ratio different from the ratio of said first capacitance to said second capacitance.

2. A device according to claim 1, wherein: said charge transfer device comprises a charge coupled device.

3. A device according to claim 1, wherein: said predetermined number of electrodes of said second plurality is chosen so that said capacitances respectively associated with said first and second conductors and exhibiting said predetermined ratio are substantially equal.

4. A device according to claim 1, wherein: said charge underlying said electrodes of said second plurality is dynamically adjustable in magnitude.

5. An arrangement according to claim 1, wherein: said signal transfer path and said auxiliary path are of substantially equal width.

6. A semiconductor electrical charge transfer device comprising:

a first plurality of spaced conductive charge transfer electrodes insulatingly disposed on a major surface of a semiconductor substrate and defining quiescent and signal charge storage locations along a signal transfer path, said first plurality comprising a first set of conductive areas coupled to a first conductor and having an associated first capacitance developed in response to charge underlying said first set of conductive areas, and a second set of conductive areas coupled to a second conductor and having an associated second capacitance developed in response to charge underlying said second set of conductive areas;

a second plurality of spaced intermediate charge transfer electrodes insulatingly disposed on said major surface of said semiconductor substrate and defining charge storage locations along said signal transfer path, said intermediate electrodes being disposed individually between said electrodes of said first plurality;

a third plurality of a predetermined number of spaced conductive electrodes insulatingly disposed on said major surface of said semiconductor substrate and defining quiescent charge storage locations of an auxiliary path adjacent to said signal transfer path, each electrode of said third plurality having an associated capacitance developed in response to charge underlying each of said electrodes;

means for conductively coupling said third plurality of electrodes of one of said first and second conductors; and wherein said number of electrodes of said auxiliary path is chosen so that quiescent capacitances respectively associated with said first and second conductors exhibit a balanced relationship different from the relationship of said first capacitance to said second capacitance.

7. A signal processing arrangement formed of semiconductor electrical charge transfer elements, comprising:

a first plurality of serially spaced conductive charge transfer electrodes insulatingly disposed on a major surface of a semiconductor substrate and defining quiescent and signal charge storage locations along a signal transfer path, said first plurality comprising a first set of conductive areas coupled to a first conductor and having an associated first capacitance developed in response to charge underlying said first set of conductive areas, and a second set of conductive areas coupled to a second conductor and having an associated second capacitance developed in response to charge underlying said second set of conductive areas;

a source of input signals coupled to said signal transfer path;

a source of first clock signals coupled to said first and second sets of conductive areas;

a second plurality of serially spaced, intermediate charge transfer electrodes insulatingly disposed on said major surface of said semiconductor substrate and defining charge storage locations along said signal transfer path, said intermediate electrodes being disposed individually between said electrodes of said first plurality;

a source of second clock signals of a different phase than said first clock signals coupled to said intermediate electrodes;

differential signal combining means having first and second inputs coupled to said first and second conductors, respectively;

a third plurality of a predetermined number of spaced conductive electrodes insulatingly disposed on said major surface of said semiconductor substrate and defining quiescent charge storage locations of an auxiliary path adjacent to said signal transfer path, each electrode of said third plurality having an associated capacitance developed in response to charge underlying each of said electrodes;

a fourth plurality of intermediate charge transfer electrodes insulatingly disposed on said major surface of said semiconductor substrate and disposed individually between said electrodes of said third plurality, and coupled to said source of second clock signals;

means for conductively coupling said third plurality of electrodes to one of said first and second conductors; and wherein said number of electrodes of said auxiliary path is chosen so that quiescent capacitances respectively associated with said first and second conductors exhibit a balanced relationship different from the relationship of said first capacitance to said second capacitance.

8. An arrangement according to claim 7, wherein:

said clock signals from said first and second sources are of mutually opposite phase.

9. An arrangement according to claim 8, wherein: said clock signals from said first source are capacitively coupled to said first and second conductive areas.

10. An arrangement according to claim 8, wherein: said first and second sets of conductive areas of said first plurality of electrodes are arranged as signal weighting electrodes of a transversal filter.

11. An arrangement according to claim 8, wherein: electrodes of said first plurality are defined by first and second electrode portions having predetermined first and second surface areas, a sum of said first electrode portions comprising said first set of conductive areas, a sum of said second electrode portions comprising said second set of conductive areas, and the ratio between said first and second areas of each electrode portion being determinative of a selected signal weighting factor.

12. An arrangement according to claim 11, wherein: said arrangement comprises a transversal filter with said first and second sets of conductive areas being of relatively unequal surface area.

* * * * *